`US009318216B2`

(12) United States Patent
Ma et al.

(10) Patent No.: US 9,318,216 B2
(45) Date of Patent: Apr. 19, 2016

(54) MULTILEVEL CELL NONVOLATILE MEMORY SYSTEM

(71) Applicant: Samsung Electronics Co., Ltd., Gyeonggi-do (KR)

(72) Inventors: Jin-Hee Ma, Seoul (KR); Da-Woon Jung, Gyeonggi-do (KR); Byung-Hei Jun, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 359 days.

(21) Appl. No.: 13/798,419

(22) Filed: Mar. 13, 2013

(65) Prior Publication Data

US 2014/0208002 A1    Jul. 24, 2014

(51) Int. Cl.
| G06F 13/00 | (2006.01) |
| G06F 13/28 | (2006.01) |
| G11C 16/34 | (2006.01) |
| G06F 11/20 | (2006.01) |
| G06F 12/02 | (2006.01) |
| G06F 11/00 | (2006.01) |
| G11C 11/56 | (2006.01) |
| G06F 3/06 | (2006.01) |

(52) U.S. Cl.
CPC .............. G11C 16/349 (2013.01); G06F 11/00 (2013.01); G06F 11/2056 (2013.01); G06F 12/0246 (2013.01); G11C 11/5628 (2013.01); G06F 3/065 (2013.01); G06F 3/0619 (2013.01); G06F 3/0679 (2013.01); G06F 2212/1032 (2013.01)

(58) Field of Classification Search
CPC ..... G06F 3/0619; G06F 3/065; G06F 3/0679; G06F 11/2056; G06F 12/0246; G06F 2212/1032; G11C 16/349; G11C 11/5628
See application file for complete search history.

(56) References Cited

U.S. PATENT DOCUMENTS

| 7,719,893 | B2 | 5/2010 | Kim et al. |
| 7,755,950 | B2 | 7/2010 | Yu et al. |
| 7,813,173 | B2 | 10/2010 | Woo et al. |
| 7,990,765 | B2 | 8/2011 | Park et al. |
| 8,031,522 | B2 | 10/2011 | Jang et al. |
| 2003/0165076 | A1* | 9/2003 | Gorobets et al. .............. 365/200 |
| 2007/0297265 | A1 | 12/2007 | Kim et al. |
| 2009/0013139 | A1* | 1/2009 | Woo et al. ..................... 711/162 |
| 2011/0199822 | A1 | 8/2011 | Yoon et al. |
| 2011/0216587 | A1* | 9/2011 | Lee .......................... 365/185.03 |
| 2013/0138871 | A1* | 5/2013 | Chiu et al. ..................... 711/103 |

* cited by examiner

*Primary Examiner* — Edward Dudek, Jr.
(74) *Attorney, Agent, or Firm* — F.Chau & Associates, LLC

(57) ABSTRACT

A multilevel cell (MLC) nonvolatile memory system including a plurality of memory cells each cell storing first bit data and second bit data, and a controller programming the plurality of memory cells on a page-by-page basis, the controller programming original data to an original block and programming copy data that is the same as the original data to a mirroring block, wherein first bit page data and second bit page data of the original data are programmed to memory cells connected to the same word line, but the first bit page data and second bit page data of the copy data are programmed to memory cells connected to different word lines.

16 Claims, 13 Drawing Sheets

MULTILEVEL CELL NONVOLATILE MEMORY SYSTEM

CROSS-REFERENCE TO RELATED APPLICATION

This application claims priority under 35 U.S.C. 119 of Korean Patent Application No 10-2013-0018804 filed on Jan. 21, 2013 in the Korean Intellectual Property Office, which is herein incorporated by reference in its entirety.

TECHNOLOGICAL FIELD

The inventive concept relates to a multi level cell nonvolatile memory system.

DISCUSSION OF THE RELATED ART

Memory devices may be classified as volatile memory devices and nonvolatile memory devices. Volatile memory devices lose stored data in the absence of applied power. Volatile memories include static RAMs (SRAMs), dynamic RAMs (DRAMs) and a synchronous DRAM (SDRAM). Nonvolatile memory devices retain stored data in the absence of applied power. Nonvolatile memory devices include a flash memory, a read only memory (ROM), programmable ROMs (PROMs), electrically erasable and programmable ROMs (EEPROMs), resistive memories (e.g., phase-change RAM, ferroelectric RAM (FRAM), resistive RAM (RRAM), etc.

SUMMARY OF THE INVENTIVE CONCEPT

Various aspects of the inventive concept provide a multi-level cell (MLC) nonvolatile NAND FLASH memory system, that can secure the reliability of stored data.

According to an aspect of the inventive concept, there is provided a multilevel cell (MLC) nonvolatile memory system including a plurality of memory cells each memory cell storing first bit (e.g., LSB) data and second bit (e.g., MSB) data, and a controller for programming the plurality of memory cells on a page-by-page basis, the controller programming original data to an original memory block and programming copy data that is the same as the original data to a mirroring memory block, wherein first bit page data and second bit page data of the original data are programmed to memory cells connected to the same word line, and first bit page data and second bit page data of the copy data are programmed to memory cells connected to two different word lines.

According to an aspect of the inventive concept, there is provided a multilevel cell (MLC) nonvolatile memory system including a plurality of memory cells connected to the same word line and each memory cell storing first bit (e.g., LSB) data and second bit (e.g., MSB) data, and a controller programming the plurality of memory cells on a page-by-page basis, the controller programming original data to a first block and programming copy data that is the same as the original data to a second block, wherein the controller programs the original data starting at a first page address of the first block and programs the copy data starting at a second page address of the second block, and the first page address and the second page address are different from each other.

According to another aspect of the inventive concept, there is provided a multilevel cell (MLC) nonvolatile memory system comprising: an original block including a plurality of word lines, each word line having a plurality of multilevel cells; and at least one mirroring block including a plurality of word lines, each word line having a plurality of multilevel cells; and a controller configured to program first bit data and second bit data into each of the plurality of memory cells on a page-by-page basis, the controller programming original first bit data and original second bit data to first and second pages at the first wordline of the original block and programming copy first bit data and copy second bit data that is the same as the original data to the at least one mirroring block, wherein first bit data and second bit data of the original data are programmed to memory cells of the same word line of the original block, and first bit data and second bit data of the copy data are programmed to memory cells of different word lines of the at least one mirroring block.

The inventive concept will now be described more fully hereinafter with reference to the accompanying drawings, in which preferred exemplary embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

The use of the terms "a" and "an" and "the" and similar referents in the context of describing the inventive concept (especially in the context of the following claims) are to be construed to cover both the singular and the plural, unless otherwise indicated herein or clearly contradicted by context.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The inventive concept will be described with reference to plan views, in which exemplary embodiments of the inventive concept are shown. The exemplary embodiments of the inventive concept are not intended to limit the scope of the inventive concept but cover all changes and modifications that can be made.

Hereinafter, embodiments of the inventive concept will be described with reference to the accompanying drawings.

BRIEF DESCRIPTION OF THE DRAWINGS

The above and other features of the inventive concept will become more apparent by describing in detail preferred embodiments thereof with reference to the attached drawings in which.

DETAILED DESCRIPTION OF THE EXEMPLARY EMBODIMENTS

Figure 1:
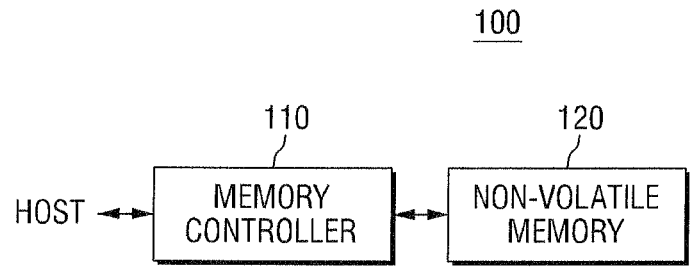
FIG. 1 is a block diagram of a memory system including a nonvolatile memory device.

FIG. 1 is a block diagram of a memory system 100 including a nonvolatile memory device.

Referring to FIG. 1, the memory system 100 includes a memory controller 110 and a nonvolatile memory device 120.

The memory controller 110 is connected to a host and the nonvolatile memory device 120. The memory controller 110 may be configured to access the nonvolatile memory device 120 in response to a request from the host. For example, the memory controller 110 may be configured to control program, read and erase operations of the nonvolatile memory device 120. The memory controller 110 is configured to provide interfacing between the host and the nonvolatile memory device 120. The memory controller 110 is configured to drive firmware for controlling the nonvolatile memory device 120.

As an example, the memory controller 110 may further include well known components, including a random access memory (RAM), a processing unit, a host interface, or a memory interface. The RAM may be used as at least one of an operating memory of the processing unit, a cache memory between the host and the nonvolatile memory device 120, and a buffer memory between the host and the nonvolatile memory device 120. The processing unit controls the overall operation of the memory controller 110. The host interface may include a protocol to exchange data between the host and the memory controller 110. For example, the memory controller 110 may be configured to communicate with an external device (host) through one of various interface protocols such as universal serial bus (USB), multimedia card (MMC), peripheral component interconnection (PCI) protocol, PCI-express (PCI-E) protocol, advanced technology electronics (ATA) protocol, serial-ATA protocol, parallel-ATA protocol, small computer small interface (SCSI) protocol, enhanced small disk interface (ESDI) protocol, and integrated drive electronics (IDE) protocol.

The memory interface interfaces with the nonvolatile memory device 120.

Figure 2:
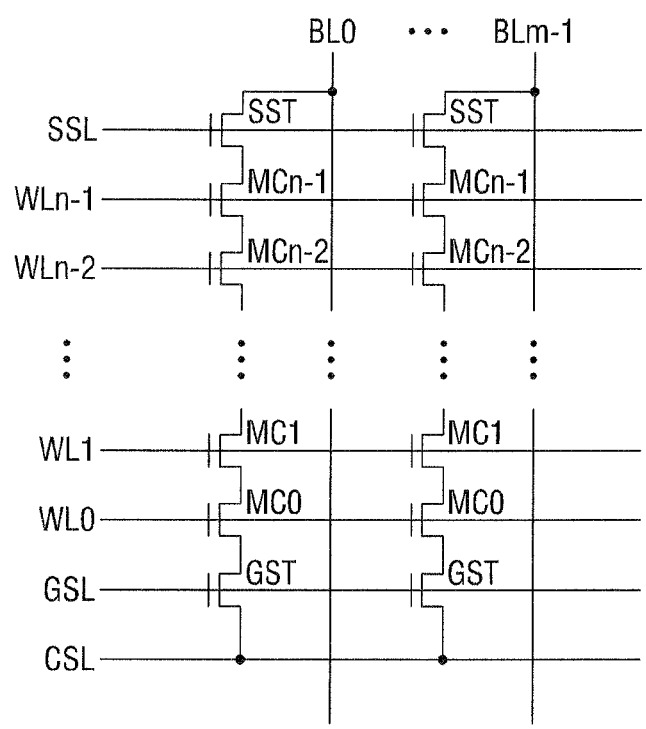
FIG. 2 is a circuit diagram of a memory block in the nonvolatile memory device in FIG. 1.

The nonvolatile memory device 120 includes a memory cell array (See FIG. 2). The memory cell array includes a plurality of memory cells (MCs) arranged in a plurality of rows and a plurality of columns. Each memory cell may be configured to store 1-bit data or N-bit (multi-bit) data. The memory cell array may be implemented by a single level cell (SLC), a multi level cell (MLC) or a combination of SLC and MLC.

The memory cell array may be divided into a data area for storing general data, and a spare area for additional information associated with the general data (for example, flag information, an error correction code, a device code, a maker code, page information, etc.). The respective memory cells included in the data area may be configured to store 1-bit data or N-bit data. The respective memory cells included in the spare area may also be configured to store 1-bit data or N-bit data.

In the present embodiment of the inventive concept, the nonvolatile memory device 120 may be configured by a multilevel cell flash memory. In the following description, the multilevel cell flash memory will be described with regard to a multilevel cell flash memory for storing 2-bit data by way of example. The inventive concept may be applied to any type of multilevel cell flash memory, irrespective of the number of bits stored in the MLC. However, for brevity, the embodiment of the inventive concept will be described with regard to a case where the MLC stores 2-bit data.

The memory system 100 may be configured to further include an error correction block. The error correction block detects an error of data read from the nonvolatile memory device 120 using an error correction code (ECC) and then corrects the error. As an example, the error correction block may be provided as a component of the memory controller 110. Alternatively, the error correction block may also be provided as a component of the nonvolatile memory device 120.

The memory controller 110 and the nonvolatile memory device 120 may be integrated into one semiconductor device. As an example, the memory controller 110 and the nonvolatile memory device may be integrated into one semiconductor device to form a memory card. For example, the memory controller 110 and the nonvolatile memory device 120 may be integrated into one semiconductor device to form a PC card (originally PCMCIA or PCMCIA card), a Compact Flash (CF) card, a Smart Media (SM) Card, a memory stick, a Multi Media Card (MMC, RS-MMC, MMCmicro), a Secure Digital card (SD, miniSD, microSD), a Universal Flash storage (UFS), and the like.

The memory controller 110 and the nonvolatile memory device 120 may be integrated into one semiconductor device to form a Solid State Disk/Drive (SSD). The SSD include a storage device configured to store data in a semiconductor memory.

When the memory system 100 is used as the SSD, the operating speed of a host connected to the memory system 100 can be remarkably improved.

As another example, the memory system 100 according to the embodiment of the inventive concept can be applicable to one of various electronic devices, such as a computer, an Ultra Mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television, a digital audio recorder, a digital picture player, a digital video recorder, a digital video player, a wireless transmitter-receiver, a home network device, a computer network, a telematix network, a RFID device or one of various elements comprising a computing system.

In addition, the nonvolatile memory device 120 or the memory system 100 may be mounted in various packages. For example, the nonvolatile memory device 120 or the memory system 100 may be mounted in various packages, such as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

FIG. 2 is a circuit diagram of a memory block in the memory cell array in the nonvolatile memory device 120 in FIG. 1.

Referring to FIG. 2, memory cells constituting the memory block have a NAND string interconnection structure. The NAND string structure shown in FIG. 2 may be applied not only to memory cells in the data area but also to memory cells in the spare area.

The memory block includes a plurality of NAND strings corresponding to a plurality of columns or bit lines BL0 to BLm−1. Each NAND string includes a string select transistor SST, a plurality of memory cells MC0 to MCn−1, and a ground select transistor GST. In each string, the drain of the string select transistor SST is be connected to a corresponding bit line and the source of the ground select transistor GST is be connected to a common source line CSL. The plurality of memory cells MC0 to MCn−1 are connected in series to each other between the source of the string select transistor SST and the drain of the ground select transistor GST. The gates of the memory cells arranged on the same row are commonly connected to a the same wordlines, and each of the memory cells corresponds to one of the word lines WL0 to WLn−1. The string select transistor SST is controlled by a voltage applied through the string select line SSL, and the ground select transistor GST is controlled by a voltage applied through the ground select line GSL. The memory cells MC0 to MCn−1 are controlled by voltages applied through the corresponding word lines WL0 to WLn−1. The memory cells connected to the respective word lines WL0☐WLn−1 may store data corresponding to one page or multiple pages.

The nonvolatile memory device 120 may be implemented as a NAND flash memory. A program operation and a read operation of the NAND flash memory are performed on a page-by-page basis, and an erase operation of programmed data is performed on a basis of multiple pages. During the program operation, page addresses are continuously allocated in a word line direction, or may be non-continuously allocated. Information concerning a program operation or an erase operation of each page may be stored in the memory cells allocated to the spare area (or a portion of the data area). In a case of MLCs storing N-bit data, the program operation of each bit may be independently performed N times to the maximum. Each program operation consists of a plurality of program-and-verify loops.

In the present embodiment of the inventive concept, the nonvolatile memory device 120 stores 2 (or more) bits in a memory cell. Among the bits stored in the memory cell, the lowermost bit is referred to as a least significant bit (LSB), and the uppermost bit is referred to as the most significant bit (MSB). A LSB and a MSB are programmed to the each memory cell connected to the same word line. In this case, when a lower bit is programmed or read to all the memory cells connected to the same word line, the lower bits form an LSB page, and when an upper bit is programmed or read, the upper bits form an MSB page. Since 2-bit data forms two different pages, the LSB page and MSB page are accessed (programmed or read) by different page addresses.

Figure 3:
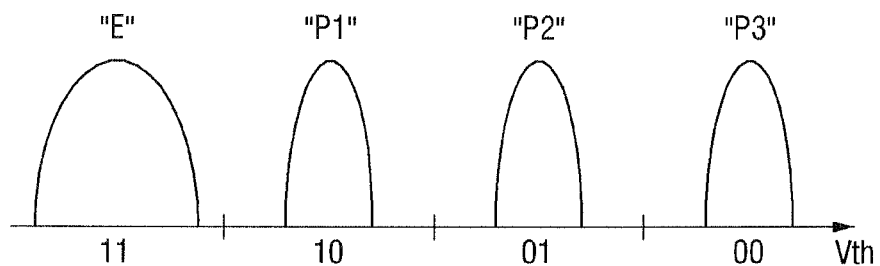
FIG. 3 is a threshold voltage distribution graph illustrating program states of the memory cells in the nonvolatile memory device in FIG. 2.

FIG. 3 is a threshold voltage distribution graph illustrating program states of the memory cells of nonvolatile memory device 120 in FIG. 2.

FIG. 3 illustrates an exemplary cell threshold voltage distribution of an MLC flash memory storing 2-bit data. The cell threshold voltage distribution shown in FIG. 3 may be modified in various manners.

Referring to FIG. 3, a 2-bit MLC memory cell may have one of four program states "E (Erase)", "P (Program) 1", "P2", and "P3". Among data values that can be stored in the 2-bit MLC, the program state "E" corresponds to a data value "11", the program state "P1" corresponds to a data value "10", the program state "P2" corresponds to a data value "01", and the program state "P3" corresponds to a data value "00".

The respective LSB and MSB bits may be independently programmed through independently performed page program operations. Each program operation may consist of a plurality of program-and-verify loops. In a case of the 2-bit MLC, for example, the LSB and the MSB may be independently programmed through an LSB page program operation and an MSB page program operation.

Figure 4:
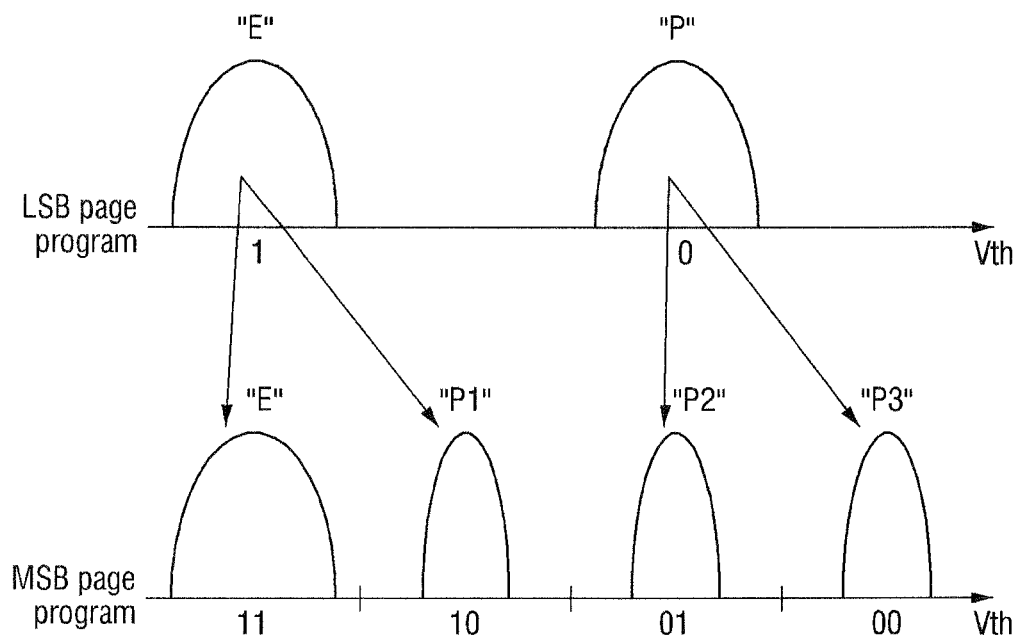
FIG. 4 is a pair of threshold voltage distribution graph illustrating a programming process of the nonvolatile memory device shown in FIG. 1.

FIG. 4 is a pair of threshold voltage distribution graph illustrating a programming process of the nonvolatile memory device shown in FIG. 1.

Referring to FIG. 4, after the LSB page program operation is performed, the MSB page program operation may be performed based on the actual threshold voltage distribution of the LSB page.

During the LSB page program operation, only the values of LSBs of the memory cells are programmed to "1" or "0" according to data values of the LSBs. Here, the MSB is maintained at an erase state. In FIG. 4, when the LSB is programmed to "1", the program state of the LSB is indicated by "E". In addition, when the LSB is programmed to "0", the program state of the LSB is indicated by "P".

After the LSB page program operation is completed, the MSB page program operation may be performed. During the MSB page program operation, the values of MSBs of the memory cells are programmed to "1" or "0". In such a manner, the respective memory cells finally have one of 4 program states. Read operations using multiple threshold voltages (Vth) make it possible to identify to which one of data values "11", "10", "01" and "00" the data values of memory cells are programmed.

Figure 5:
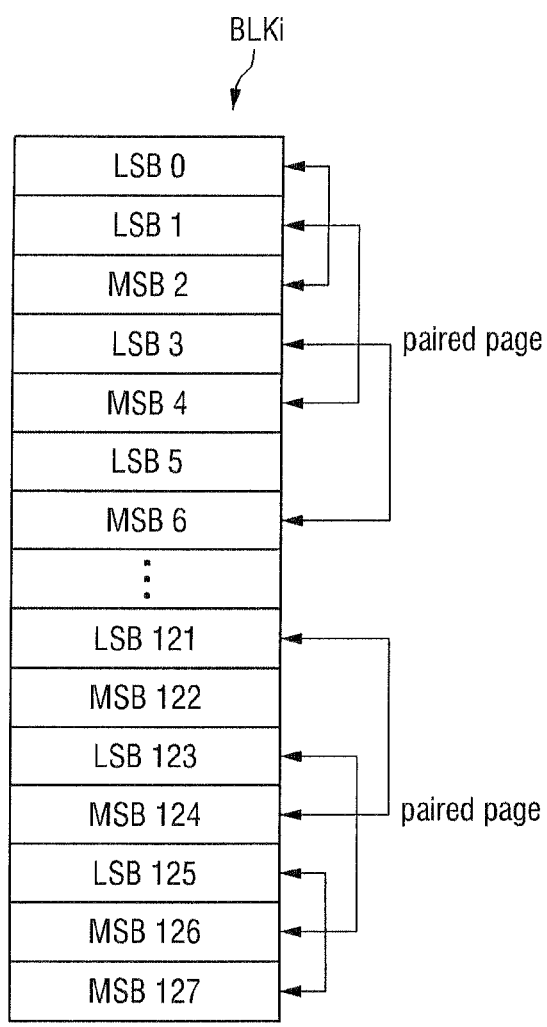
FIG. 5 is a time table illustrates a paired page structure of the nonvolatile memory device shown in FIG. 1.

FIG. 5 is a time table illustrating a paired page structure of the nonvolatile memory device 120 in FIG. 1.

Referring to FIG. 5, each memory block of the nonvolatile memory device 120 includes a plurality of pages composed of a plurality of memory cells connected to a plurality of wordlines. For example, the memory block may include 128 pages (e.g., 64 wordlines), but aspects of the inventive concept are not limited thereto.

In the embodiment of the inventive concept, each memory block is programmed in the order of pages numbered (from 0 to 127) as shown in FIG. 5. In each memory block, LSB pages and MSB pages are paired in a paired page structure as shown in FIG. 5. The LSB page and the MSB page programmed by different page addresses may be connected to each other in a paired page structure as shown in FIG. 5. The LSB pages and the MSB pages paired in the paired page structure are programmed to the memory cells connected to the same word line.

In each memory block, a starting LSB page (e.g., an LSB page of address "0") is paired with an MSB spaced one page-program time apart therefrom, the next LSB pages (e.g., LSB pages of addresses "1, 3, 5, . . . , 121, 123") are paired with MSB pages spaced two page-program times apart therefrom, and the final LSB page (e.g., an LSB page of address "125") are paired with an MSB page spaced one page-program time apart therefrom.

A starting MSB page (e.g., MSB page of time "2") may be paired with an LSB programmed one page-program time apart therefrom, the next MSB pages (e.g., MSB pages of times "4, 6, . . . , 122, 124, 126") may be paired with LSB pages programmed two page-program times apart therefrom, and the final MSB page (e.g., MSB page of address "127") may be paired with an LSB page programmed one page-program time apart therefrom.

In the present embodiment of the inventive concept, the nonvolatile memory device 120 performs LSB page program operations before performing the corresponding MSB page program operations. For this reason, if a program fail occurs due to sudden power off (SPO) or memory failure while the MSB page program operations are being performed on memory cells, data values of the LSB page, forming a paired page structure with the MSB page being programmed, may be broken (error) because the LSB page and the MSB page forming the paired page structure are programmed to the memory cells connected to the same word line.

This result may be avoided if the original data stored in an original block has been conventionally mirrored and copy of the same data has been stored in a mirroring block. Accordingly, the copy data that is the same as the original data is programmed in the mirroring block. Even if data mirroring is performed, fails may be generated both of the MSB page program operation performed on the original block and the MSB page program operation performed on the mirroring block due to SPO or memory failure. In this case, data values of the LSB page, forming a paired page structure with the MSB page of the mirroring block being programmed, may both be broken. Thus, the broken LSB page of the original block cannot be restored. This result may be avoided if during a mirroring operation of the original data, the mirroring block storing the copy data uses only LSB pages. In this case, however, the entire page space of the mirroring block cannot be used, which may increase a wear acceleration index (WAI), thereby shortening the lifetime of the flash memory device.

In the present embodiment of the inventive concept, the first bit page data and the second bit page data of the original data are programmed to memory cells connected to the same word line, while the first bit page data and the second bit page data of the copy data are programmed to memory cells connected to different word lines. The first bit page of the original data and the first bit page data of the copy data have the same value, and the second bit page of the original data and the second bit page data of the copy data have the same value. The data of the first bit page may correspond to data of LSB page of the original block, and the data of the second bit page may correspond to data of MSB page of the original block. Accordingly, even if a program fail occurs due to SPO or memory failure during program operations performed on memory cells, and a mirroring block page corresponding to the MSB page of the original block is broken, a mirroring block page corresponding to the LSB page of the original block is not broken because it is not connected to the mirroring block page corresponding to the MSB page of the original block in a paired page structure. The LSB page of the original block can be restored using the unbroken a mirroring block page.

Figure 6:
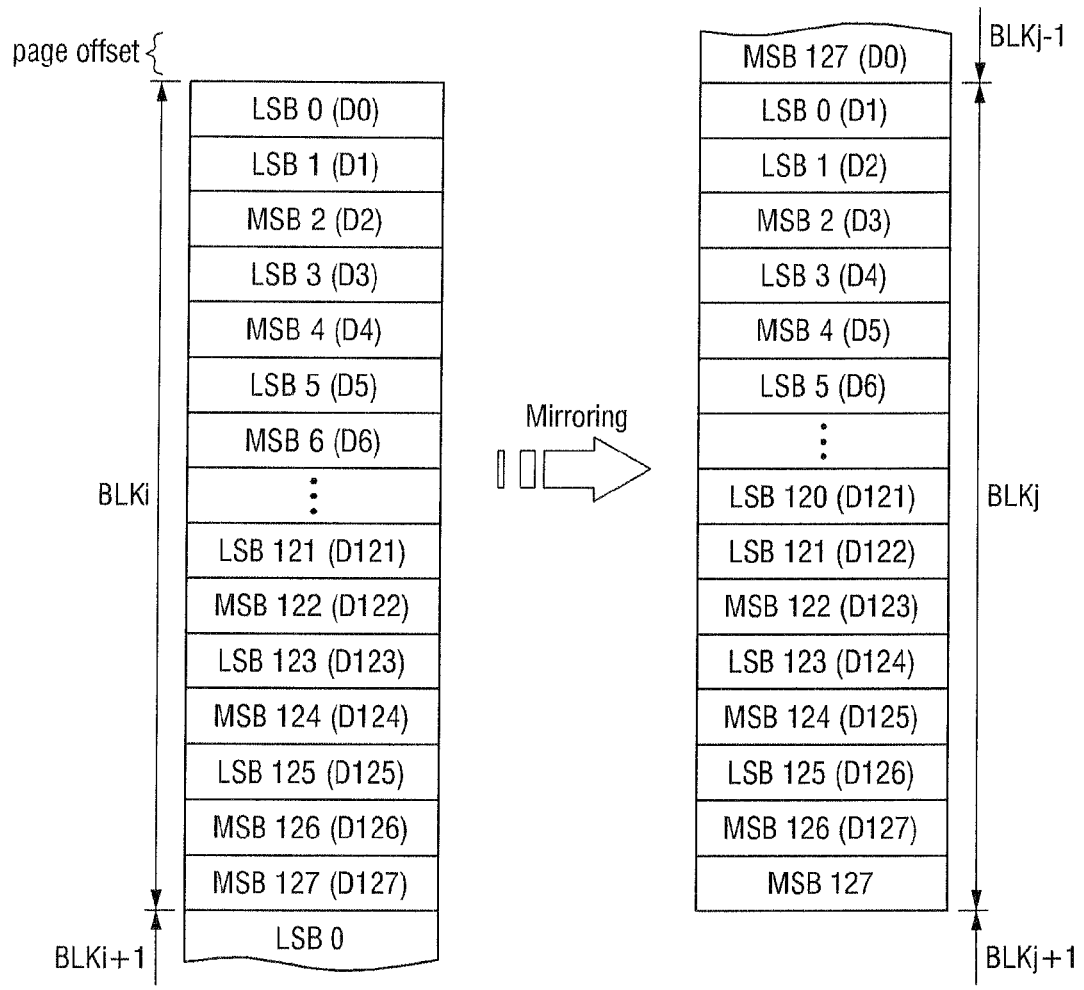
FIG. 6 comprises time tables illustrating a data mirroring method of the memory system according to an embodiment of the inventive concept.

FIG. 6 comprises time tables illustrating a data mirroring method of the memory system according to an embodiment of the inventive concept.

Referring to FIG. 6, in an embodiment of the inventive concept, the memory controller 110 programs to a mirroring block copy data values D0 to D127 the same as original data values D0 to D127 of an original block. The memory controller 110 performs LSB page or MSB page program operations of the original data bits D0 to D127 in response to a request from a host. The memory controller 110 performs time-shifted LSB page or MSB page program operations of the copy data D0 to D127.

The memory controller 110 programs data D0 to D127 from a first page address of the original block and programs data from a second page address of the mirroring block. The first page address and the second page address are different from each other by the amount of the page offset (the page offset is set equal to one in FIG. 6). As an example, the memory controller 110 programs data D0 to D127 from a starting page address of the original block BLKi and programs data D0 to D127 from a different page address according to a reference page offset of the mirroring block. Alternatively, the memory controller 110 programs data from a page address according to a reference page offset of the original block and programs data from a starting page address of the mirroring block. The reference page offset may be determined in advance.

FIG. 6 shows a case where a reference page offset is one page, that is, a case where the LSB page of address "0" of the first original block BLKi contains data D0 and data D0 is programmed at the prior MSB page of the prior mirroring block BLKi-1. In the mirroring block, data D1 is programmed from the first LSB page of address "0" that is a starting page address. Adjustment of the reference page offset may be performed only on the first original block. Since original blocks programmed after the first original block are affected by the previously performed reference page offset, additional adjustment of the reference page offset is not required.

Data values D0 to D127 are all programmed to the original block BLKi. The same data values D0 to D127 are programmed to two adjacent mirroring blocks BLKj-1 to BLKj. The data D0 has been programmed after to the LSB page of address "0" of the first original block. The data value D0 and the data values D1 to D127 may be programmed to different mirroring blocks BLKj-1 to BLKj.

As shown in FIG. 6, the data value D0 is programmed to the LSB page of address "0" in the original block BLKi by an LSB page program operation, and the data value D0 is previously programmed to the prior MSB page of address "127" in the prior mirroring block BLKj-1 by the prior MSB page program operation. The data value D2 is programmed to the MSB page of address "2" in the original block BLKi by an MSB page program operation, and data value D2 is previously programmed to the LSB page of address "1" in the mirroring block BLKj by the prior LSB page program operation. The same data values, (except for the data values D1 and D126), programmed to the LSB pages and the MSB pages in the original blocks may be programmed to the programmed to the MSB pages and the LSB pages in the mirroring blocks.

Figure 7:
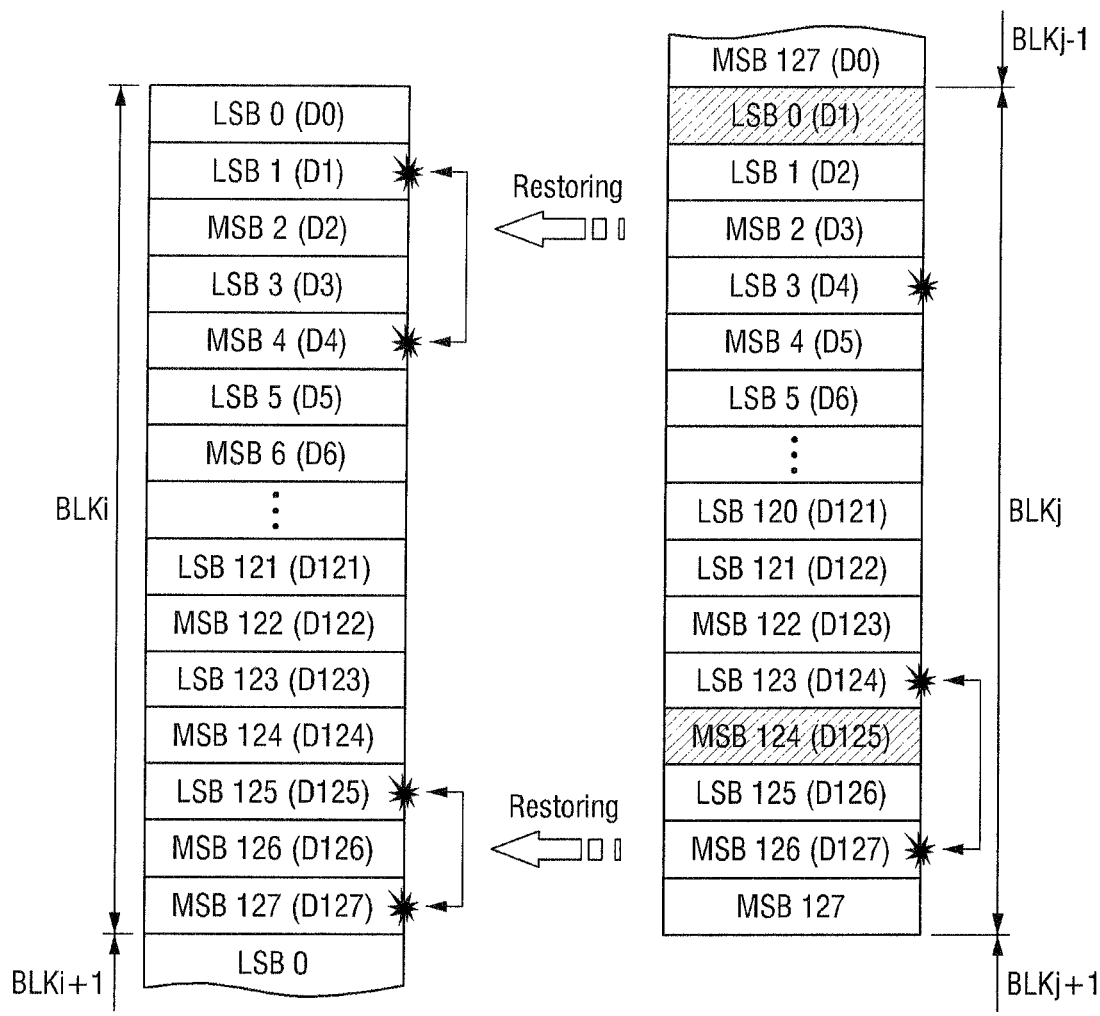
FIG. 7 comprises time tables illustrating a data restoring method of the memory system according to an embodiment of the inventive concept.

FIG. 7 comprises time tables illustrating a data restoring method of the memory system according to an embodiment of the inventive concept.

Referring to FIG. 7, as an example, it may be assumed that a fail has occurred due to SPO or memory failure during programming the MSB data value D4 in the original block at address "4". Here, the data value D4 being programmed to the original block or the mirroring block may be broken. Since the data value D4 of the original block BLKi was being programmed to the MSB of address "4", the data value D1 of the LSB page of address "1" paired with the MSB page of address "4" may also be broken. However, since the data value D4 stored in the mirroring block BLKj was being programmed to the LSB page of address "3" and the data value D1 is was programmed to the LSB page of address "0" which is not paired therewith, the data D1 is not broken. Therefore, the memory controller 110 can restore the broken data D1 stored in LSB page of address "1" of the original block BLKi using pre-mirrored data D1 stored in the unbroken LSB page of address "0" of the mirroring block BLKj.

As an example, it may also be assumed that a fail has occurred due to SPO or memory failure during programming a MSB data value D127. Here, the data value D127 being programmed to an MSB of address "127" of the original block and an MSB of address "126" of a mirroring block may be broken. Since the data value D127 of the original block BLKi was being programmed to the original block MSB page of address "127", a data value D125 of the LSB page of address "125" paired with the original block MSB page of address "127" may also be broken. However, since the data value D127 of the mirroring block BLKj was programmed to the MSB page of address "126" and the data value D125 is programmed to the MSB page of address "124" which is not paired therewith, the data D125 in the mirroring block is not broken. The data D124 of the LSB page of address "123" in the mirroring block paired with the MSB page of address "126" in the mirroring block may be broken. However, since the data D125 of the LSB page of address "124" in the mirroring block has already been programmed, there is no problem with the program operation of the data D125 in the mirroring block. Therefore, the memory controller 110 can restore the broken data D125 in the LSB page of address "125" of the original block BLKi using the unbroken data D125 stored in MSB page of address "124" of the mirroring block BLKj.

Figure 8:
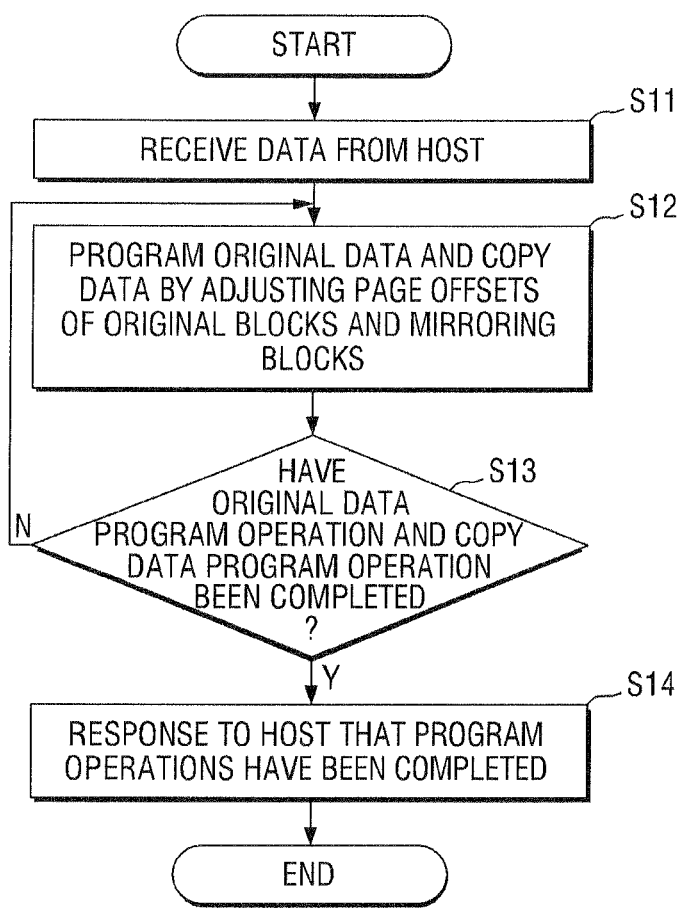
FIG. 8 is a flowchart of a method of operating the memory system according to an embodiment of the inventive concept.

FIG. 8 is a flowchart of a method of operating the memory system according to an embodiment of the inventive concept. Repeated descriptions will be omitted.

Referring to FIG. 8, first, the memory controller 110 receives data (e.g., D0 to D127) to be written from a host (step S11).

Next, the memory controller 110 programs original data (D0 to D127) and copy data (D0 to D127) by adjusting page offsets of original blocks and mirroring blocks (step S12). Here, in order to improve programming performance by increasing parallelism of program operations, the memory controller 110 may use memory blocks connected by different channels as the original block and the mirroring block. Alternatively, the memory controller 110 may use blocks of different memory banks as the original block and the mirroring block. The adjustment of the page offset is the same as described above with reference to FIG. 6.

Next, the memory controller 110 determines whether a program operation of original data (D0 to D127) and a program operation of copy data (D0 to D127) have been completed (step S13). Next, if both of the program operation of original data and the program operation of copy data have been completed, the memory controller 110 responds to the host that the program operations have been completed (step S14). Meanwhile, if the program operation of original data and the program operation of copy data have not been completed, the memory controller 110 repeatedly performs the step S12 (e.g., by restoring as above described) and step S13.

Figure 9:
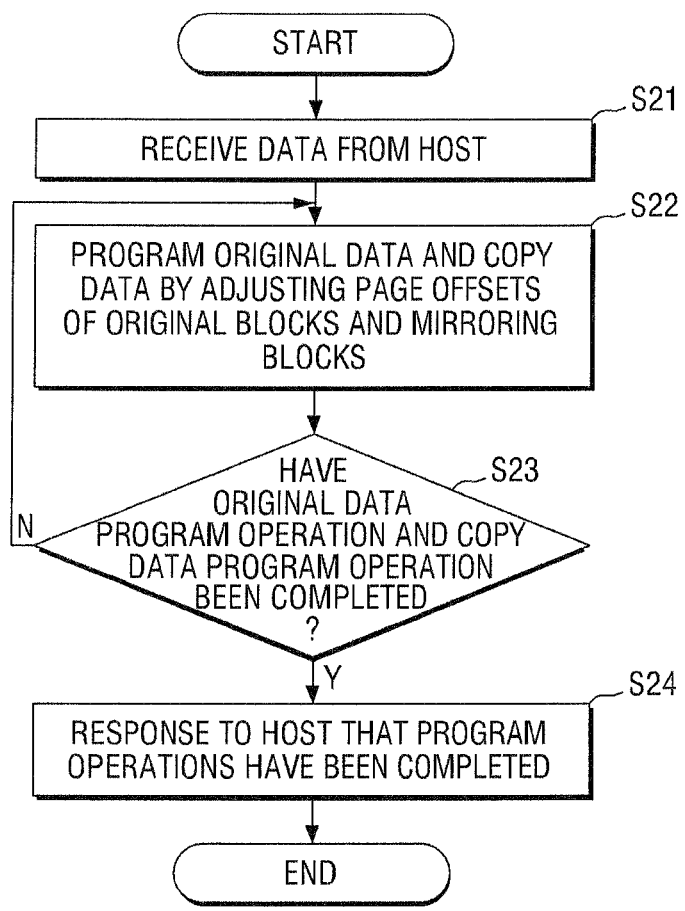
FIG. 9 is a flowchart of an application example of the method of operating the memory system according to an embodiment of the inventive concept.

FIG. 9 is a flowchart illustrating an application example of the method of operating the memory system of FIG. 1 according to an embodiment of the inventive concept. For the sake of convenient explanation, the following description will focus on differences between the operating methods shown in FIGS. 8 and 9.

Referring to FIG. 9, unlike in FIG. 8, the memory controller 110 determines whether a program operation of original data (D0 to D127) or a program operation of copy data (D0 to D127) has been completed (step S23). Next, if the program operations of all original data and all copy data has been completed, the memory controller 110 responds to the host that the program operation has been completed (step S24). Meanwhile, if the program operation of all original data or the program operation of all copy data has not been completed, the memory controller 110 repeatedly performs the step S22 (e.g., by restoring as above described) and step S23.

Figure 10:
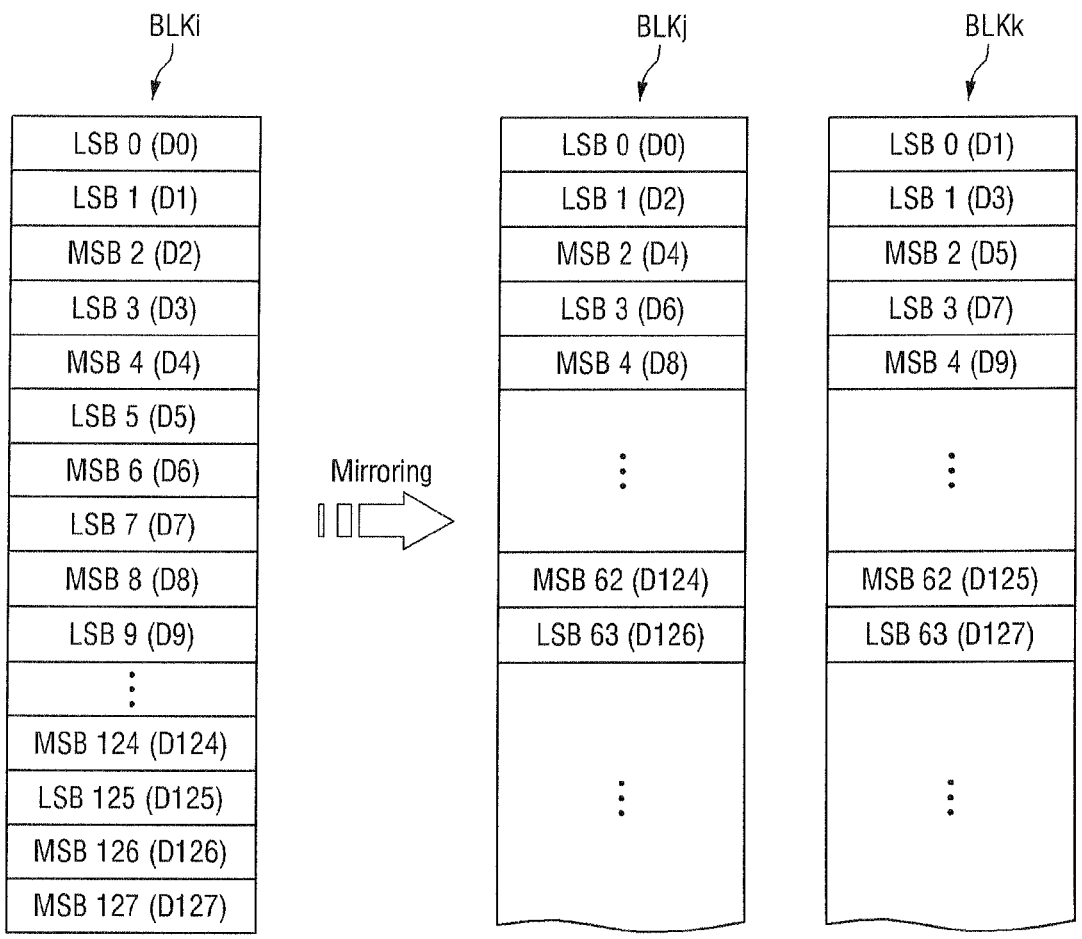
FIG. 10 illustrates a data mirroring method of a memory system according to an embodiment of the inventive concept.

FIG. 10 comprises time tables illustrating a data mirroring method of a memory system according to a an embodiment of the inventive concept.

Referring to FIG. 10, in an embodiment of the inventive concept, the memory controller 110 programs to two mirroring blocks copy data (D0 to D127) that is the same as original data (D0 to D127) of the original block. The ratio of the number of original blocks to the number of mirroring blocks may be 1:N, where N is a natural number of 2 (as shown in FIG. 10) or greater. The memory controller 110 may perform LSB page or MSB page programs of original data to a mirroring block in response to a request from the host. And, the memory controller 110 may perform LSB page or MSB page programs of copy data to a mirroring block.

The memory controller 110 separately programs to N mirroring blocks the copy data to a mirroring block corresponding to the original data to a mirroring block of an original block. First bit (D0) page data of the copy data (D0 to D127) is programmed to a first mirroring block BLKj among the N mirroring blocks, while second bit (D1) page data of the copy data (D0 to D127) is programmed to the second mirroring block BLKk among the N mirroring blocks.

FIG. 10 shows a case where the number of original blocks and the number N of mirroring blocks have a ratio of 1:2. All data values D0 to D127 are programmed to the original block BLKi. Odd data values D0, D2, . . . D124, and D126 are programmed to the first mirroring block BLKj. Even data values D1, D3, . . . , D125, and D127 are programmed to the second mirroring block BLKk.

As shown in FIG. 10, the data value D0 and the data value D1 are programmed to the LSB pages of address "0" in the first mirroring block BLKj and the second mirroring block BLKk respectively. The data value D2 and the data value D3 are programmed to the LSB pages of address "1" in the first mirroring block BLKj and the second mirroring block BLKk respectively. The data value D4 and the data value D5 are programmed to the MSB pages of address "2" in the first mirroring block BLKj and the second mirroring block BLKk, respectively. As described above, the memory controller 110 sequentially programs the data values D0 to D127 to the first mirroring block BLKj and the second mirroring block BLKk.

Figure 11:
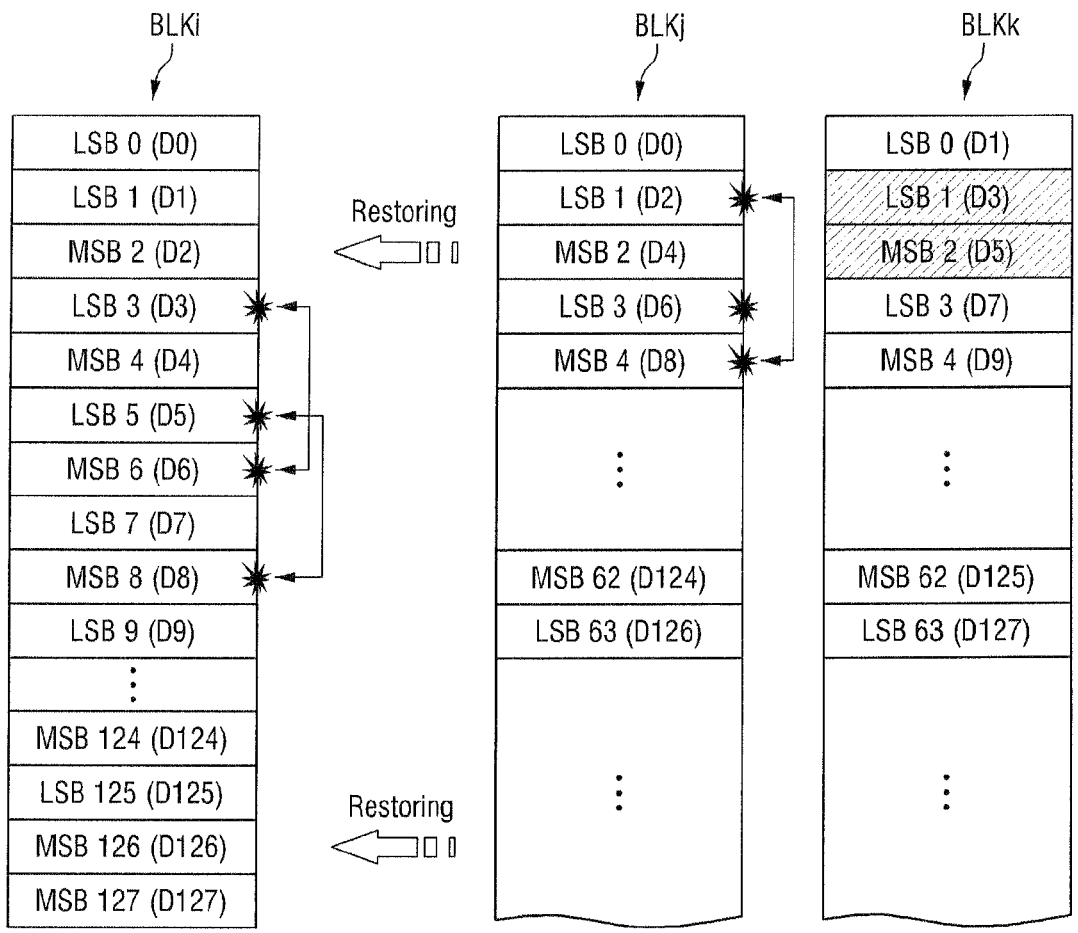
FIG. 11 illustrates a data restoring method of the memory system according to an embodiment of the inventive concept.

FIG. 11 illustrates a data restoring method of the memory system according to the an embodiment of the inventive concept.

Referring to FIG. 11, as an example, it may be assumed that a fail has occurred due to SPO or memory failure during programming the MSB data value D6. Here, the data value D6 being programmed to the MSB at address "6" in the original block may be broken. Since the data value D6 of the original block BLKi was being programmed to the MSB of address "6", the data value D3 of the LSB page of address "3" paired with the MSB of address "6" may also be broken. However, since the data value D6 of the mirroring blocks was being programmed to the LSB page of address "3" of the first mirroring block BLKj and the data value D3 was already programmed to the LSB page of address "1" of the second mirroring block BLKk, which is not paired therewith, the data D3 of the LSB page of address "1" may not be broken. Therefore, the memory controller 110 can restore the broken data D3 of LSB page of address "3" of the original block BLKi using the unbroken data D3 of LSB page of address "1" of the second mirroring block BLKk.

As an example, it may also be assumed that a fail has occurred due to SPO or memory failure during programming the data value D8. Here, the data value D8 being programmed to an original block may be broken. Since the data value D8 of the original block BLKi was being programmed to the MSB page of address "8", a data value D5 of the LSB page of address "5" paired with the MSB page of address "8" may also be broken. However, in the mirroring blocks, since the data value D8 was already programmed to the MSB page of address "4" of the first mirroring block BLKj and the data D5 was already programmed to the MSB page of address "2" of the second mirroring block BLKk, which is not paired therewith, the data D5 of the MSB page of address "2" may not be broken. In the first mirroring block BLKj, the data D2 of the MSB page of address "1" paired with the MSB page of address "4" may be broken. However, since the data D2 of the MSB page of address "1" of the original block has already been programmed, there is no problem with the program operation. Therefore, the memory controller 110 can restore data D5 of the LSB page of address "5" of the original block BLKi using the unbroken data D5 stored in MSB page of address "2" of the second mirroring block BLKk.

Figure 12:
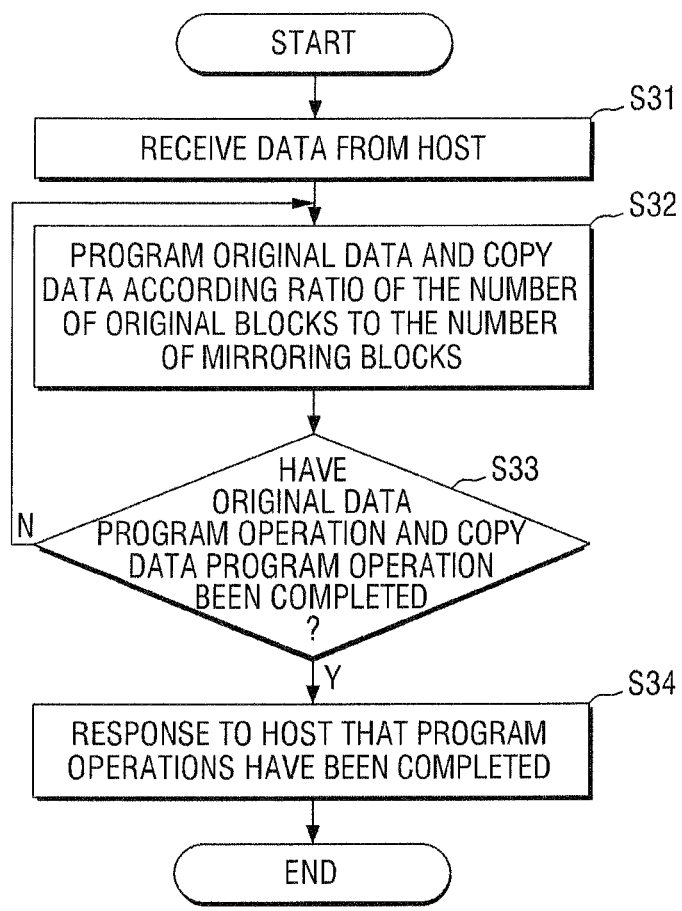
FIG. 12 is a flowchart of a method of operating the memory system according to an embodiment of the inventive concept.

FIG. 12 is a flowchart of a method of operating the memory system according to an embodiment of the inventive concept. Repeated descriptions of same steps in FIG. 9 will be omitted.

Referring to FIG. 12, first, the memory controller 110 receives data (e.g., D0 to D127) to be written from the host (step S31).

Next, the memory controller 110 programs original data (D0 to D127) and copy data (D0 to D127) according to a ratio of the number of original blocks to the number of mirroring blocks (step S32). Here, in order to improve programming performance by increasing parallelism of program operations, the memory controller 110 may use memory blocks connected by different channels as the original block and the mirroring blocks. Alternatively, the memory controller 110 may use blocks of different memory banks as the original block and the mirroring blocks. The program operation performed according to the ratio of the number of original blocks to the number of mirroring blocks is the same as described above with reference to FIG. 10.

Next, the memory controller 110 determines whether all program operations of original data (D0 to D127) and all program operations of copy data (D0 to D127) have been completed (step S33). If both of the program operation of original data and the program operation of copy data have all been completed, the memory controller 110 responds to the host that the program operations have been completed (step S34). Meanwhile, if the program operation of original data (D0 to D127) and the program operation of copy data (D0 to D127) have not been all completed, the memory controller 110 repeatedly performs the steps S32 and S33 as necessary.

Figure 13:
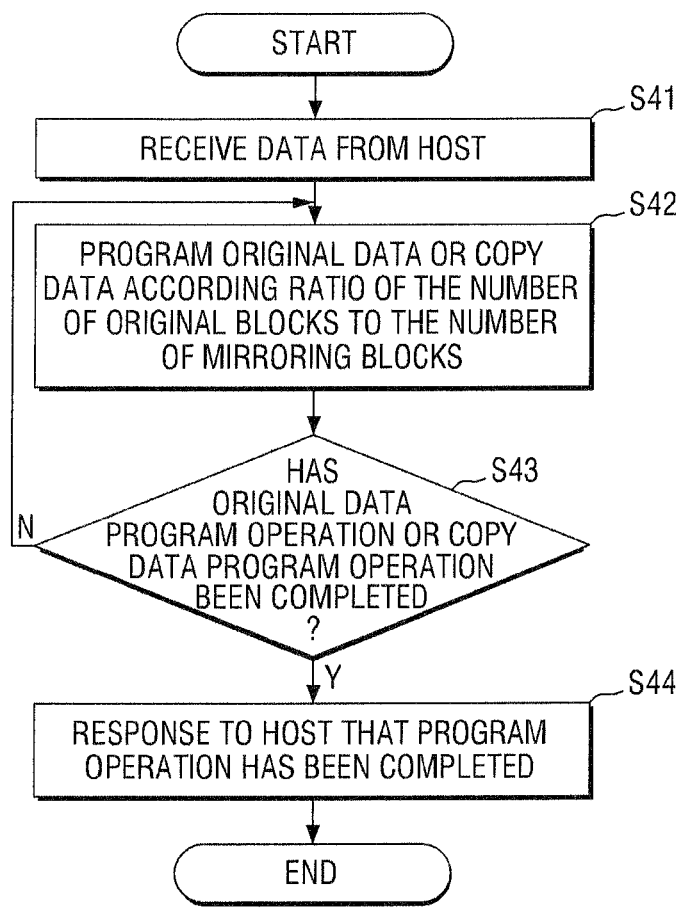
FIG. 13 is a flowchart of an application example of the method of operating the memory system according to an embodiment of the inventive concept.

FIG. 13 is a flowchart of an application example of the method of operating the memory system according to the embodiment of the inventive concept. For the sake of convenient explanation, the following description will focus on differences between the operating methods shown in FIGS. 12 and 13.

Referring to FIG. 13, unlike in FIG. 12, the memory controller 110 determines whether a program operation of original data or a program operation of copy data has been completed (step S43). Next, if all program operations of original data (D0 to D127) and copy data (D0 to D127) have been completed, the memory controller 110 responds to the host that the program operation has been completed (step S44). Meanwhile, if all the program operations of original data or the program operation of copy data have not been completed, the memory controller 110 repeatedly performs the steps S42 and step S43.

Figure 14:
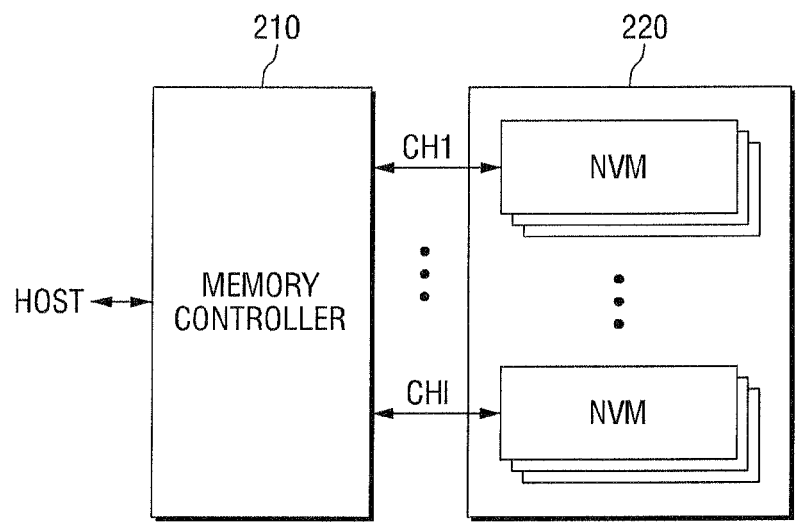
FIG. 14 is a block diagram of an application example of the memory system including the nonvolatile memory device shown in FIG. 1.

FIG. 14 is a block diagram of an application example of the memory system including the nonvolatile memory device shown in FIG. 1. For the sake of convenient explanation, the following description will focus on differences between the memory systems shown in FIGS. 1 and 14.

Referring to FIG. 14, the memory system 200 includes a memory controller 210 and a nonvolatile memory device 220.

The nonvolatile memory device 220 includes a plurality of nonvolatile memory chips. The plurality of nonvolatile memory chips may be divided into a plurality of groups. Each group of the plurality of nonvolatile memory chips may be configured to interface with the memory controller 210 through a common channel. For example, the plurality of nonvolatile memory chips may interface with the memory controller 210 through first to lth channels CH1 to CHl.

Each of the plurality of nonvolatile memory chips may be configured in substantially the same manner as the nonvolatile memory device 120 shown in FIG. 1.

While the memory system 200 shown in FIG. 14 has the plurality of nonvolatile memory chips connected to one channel, it may be modified such that one nonvolatile memory chip is connected to one channel.

Figure 15:
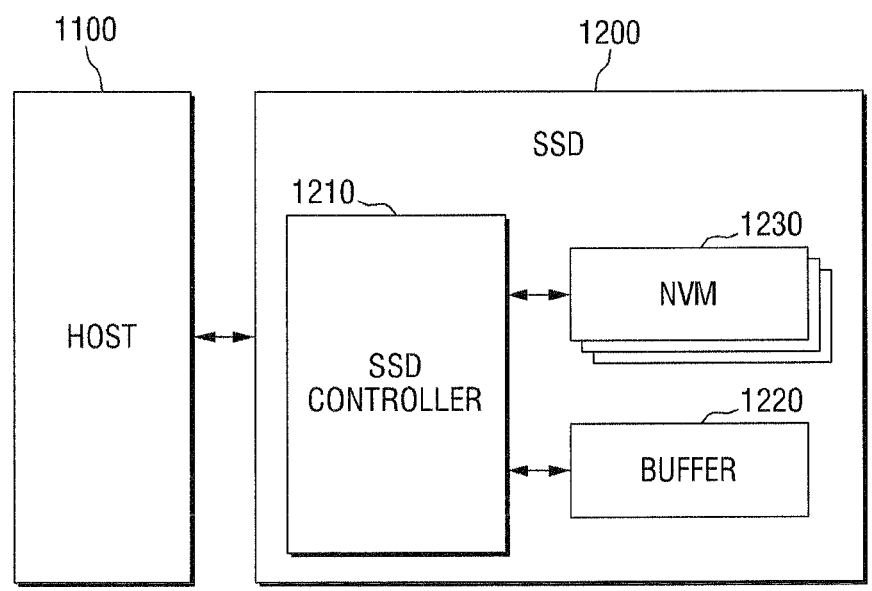
FIG. 15 is a block diagram of a user device including a solid state drive.

FIG. 15 is a block diagram of a user device including a solid state drive.

Referring to FIG. 15, the user device 1000 includes a host 1100 and an SSD 1200.

The SSD 1200 includes an SSD controller 1210, a buffer memory 1220, and a nonvolatile memory device (NVM) 1230.

The SSD controller 1210 may be configured to provide interfacing between the host 1100 and the SSD 1200. The SSD controller 1210 decodes a command provided from the host 1100 and accesses the nonvolatile memory device 1230.

The buffer memory 1220 is configured to temporarily store write data received from the host 1100 or data read from the nonvolatile memory device 1230. The buffer memory 1220 may be provided as a synchronous DRAM to sufficient buffering capacity in the SSD 1200 used as a large-capacity auxiliary memory device.

The nonvolatile memory device 1230 may be provided as a storage medium of the SSD 1200. The nonvolatile memory device 1230 may include a plurality of memories. Examples of the nonvolatile memory device 1230 may include a NAND flash memory, PRAM, MRAM, ReRAM, FRAM, NOR flash memory, and so on. A combination of different kinds of memories may also be used as the nonvolatile memory device 1230. The nonvolatile memory device 1230 may be configured in substantially the same as the nonvolatile memory device 120 shown in FIG. 1.

Figure 16:
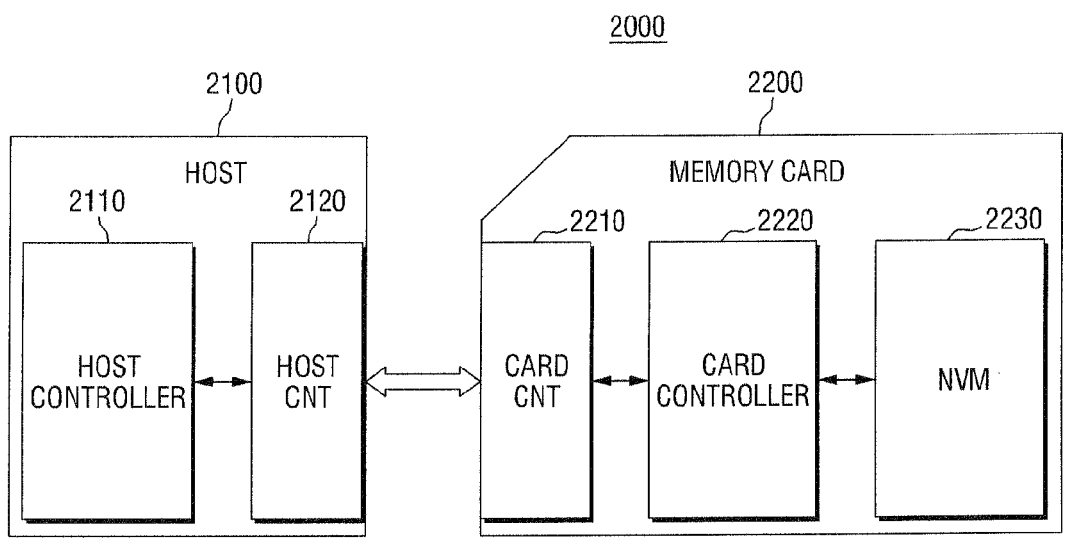
FIG. 16 is a block diagram of a card system including a memory card.

FIG. 16 is a block diagram of a card system including a memory card.

The card system 2000 includes a host 2100 and a memory card 2200.

The host 2100 includes a host controller 2110, and a host connection unit 2120. The memory card 2200 includes a card connection unit 2210, a card controller 2220, and a nonvolatile memory device (NVM) 2230.

Each of the host connection unit 2120 and the card connection unit 2210 may include a plurality of pins. The plurality of pins may include a command pin, a data pin, a clock pin, a power pin, and so on. The number of pins may vary according to the kind of the memory card 2200.

The host 2100 may be configured to write data to the memory card 2200 or to read data stored in the memory card 2200. The host controller 2110 may transmit a command CMD, a clock signal CLK, data DAT, etc. to the memory card 2200 through the host connection unit 2120.

The card controller 2220 may be configured to write data to the nonvolatile memory device 2230 or to read data from the nonvolatile memory device 2230 in response to a command received through the card connection unit 2210. The nonvolatile memory device 2230 may be configured in substantially the same manner as the nonvolatile memory device 120 shown in FIG. 1.

Figure 17:
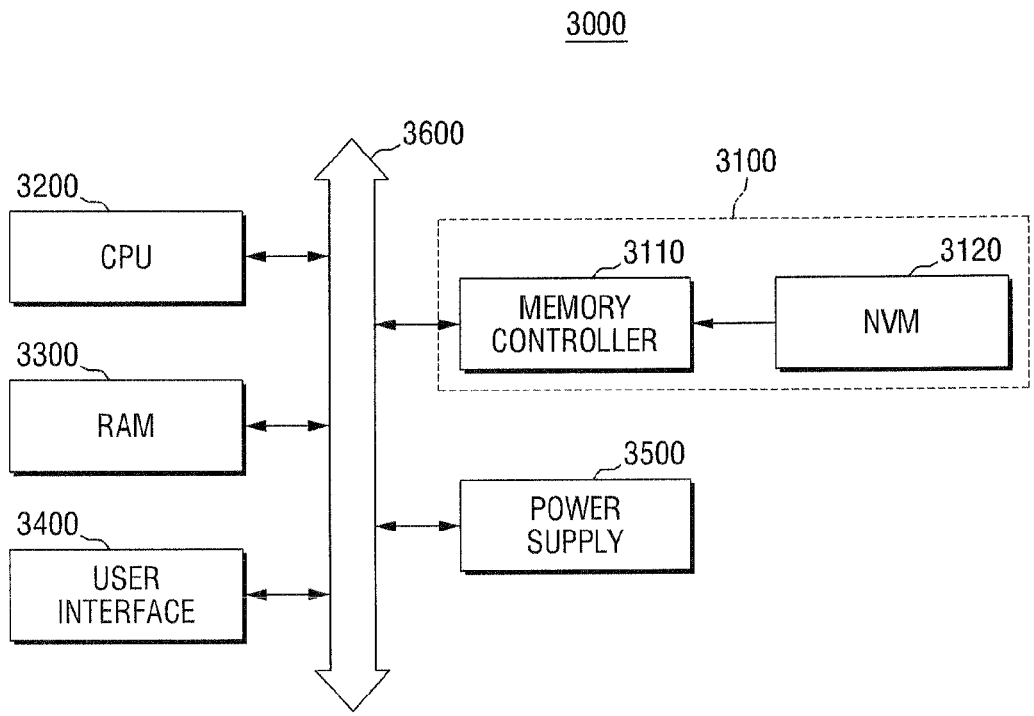
FIG. 17 is a block diagram of a computing system including the memory system shown in FIG. 1 or 14.

FIG. 17 is a block diagram of a computing system including the memory system shown in FIG. 1 or 14.

Referring to FIG. 17, the computing system 300 includes a memory system 3100, a central processing unit (CPU) 3200, an RAM 3300, a user interface 3400, and a power supply 3500.

The memory system 3100 is connected to the CPU 3200, the RAM 3300, the user interface 3400, and the power supply 3500 through a system bus 3600. Data provided through the user interface 3400 or processed by the CPU 3200 may be stored in the memory system 3100.

While FIG. 17 shows that the nonvolatile memory device 3120 is connected to the system bus 3600 through the memory controller 3110, the nonvolatile memory device 3120 may be modified to be directly connected to the system bus 3600.

The memory system 3100 may be implemented in substantially the same manner as the memory system 100 shown in FIG. 1. The memory system 3100 may also be provided in substantially the same manner as the memory system 200 shown in FIG. 14. Meanwhile, the computing system 3000 may also be configured to include both of the memory systems 100 and 200 shown in FIGS. 1 and 14.

In concluding the detailed description, those skilled in the art will appreciate that many variations and modifications can be made to the preferred embodiments without substantially departing from the principles of the inventive concept. Therefore, the disclosed preferred embodiments of the inventive concept are used in a generic and descriptive sense only and not for purposes of limitation.

What is claimed is:

1. A multilevel cell (MLC) nonvolatile memory system comprising:
   a plurality of memory cells; and
   a controller configured to program first bit data and second bit data into each of the plurality of memory cells on page-by-page basis, the controller programming original first bit data and original second bit data to first and second pages of an original block and programming copy first bit data and copy second bit data that is the same as the original data to at least one mirroring block, wherein first bit data and second bit data of the original data are programmed to memory cells connected to the same word line, and first bit data and second bit data of the copy data are programmed to memory cells connected to different word lines.

2. The MLC nonvolatile memory system of claim 1, wherein the controller programs the original data starting at first page address of the original block and programs the copy data starting at a second page address of the mirroring block, and wherein the first page address and the second page address are different from each other.

3. The MLC nonvolatile memory system of claim 2, wherein the controller programs the original data at a starting page address of the original block and programs the copy data at a page address according to a page offset of the mirroring block.

4. The MLC nonvolatile memory system of claim 2, wherein the controller programs the original data starting at a page address according to page offset of the original block and programs the copy data from a starting page address of the mirroring block.

5. The MLC nonvolatile memory system of claim 1, wherein the controller sequentially programs the copy data to N mirroring blocks alternately, where N is a natural number of 2 or greater.

6. The MLC nonvolatile memory system of claim 5, wherein the copy first bit data of the copy data is programmed to a first mirroring block among the N mirroring blocks, and the copy second bit data of the copy data is programmed to a second mirroring block among the N mirroring blocks.

7. The MLC nonvolatile memory system of claim 1, wherein the first bit data of the original data and the copy first bit data of the copy data have the same value, and the second bit data of the original data and the copy second bit data of the copy data have the same value.

8. The MLC nonvolatile memory system of claim 1, wherein the controller performs a program operation of the first bit data and performs a program operation of the second bit data after the program operation of the first bit data is performed.

9. The MLC nonvolatile memory system of claim 8, wherein if the first bit data of the original data is broken, the controller restores the first bit data of the original data using the copy first bit data of the copy data.

10. A multilevel cell (MLC) nonvolatile memory system comprising:
    a plurality of memory cells; and
    a controller configured to program two bit information into each of the plurality of memory cells on a page-by-page basis, the controller programming original data to a first block and programming copy data that is the same as the original data to a second block,
    wherein the controller programs sequentially the original data from a first page address of the first block and programs sequentially the copy data from a second page address of the second block, wherein the first page address and the second page address are different from each other so that a first bit data of the original data and a corresponding first bit data of the copy data are programmed in different page addresses of the first page address and the second page address, respectively.

11. The MLC nonvolatile memory system of claim 10, wherein the controller programs the original data from a starting page address of the first block and programs the copy data from a page address according to page offset of the second block.

12. The MLC nonvolatile memory system of claim 10, wherein the controller programs the original data from a page address according to a page offset of the first block and programs the copy data from a starting page address of the second block.

13. The MLC nonvolatile memory system of claim 10, wherein the controller performs a program operation of the first bit page and performs a program operation of the second bit page after the program operation of the first bit page is performed.

14. The MLC nonvolatile memory system of claim 13, wherein when the first bit of data of the original data is broken, the controller restores the first bit of data of the original data using the first bit of data of the copy data.

15. The MLC nonvolatile memory system of claim 13, wherein the first bit page is a least significant bit (LSB) page, and the second bit page is a most significant bit (MSB) page.

16. A multilevel cell (MLC) nonvolatile memory system comprising:
   an original block including a plurality of word lines, each word line having a plurality of multilevel cells;
   at least one mirroring block including a plurality of word lines, each word line having a plurality of multilevel cells; and
   a controller configured to program first bit data and second bit data into each of the plurality of memory cells on a page-by-page basis, the controller programming original first bit data and original second bit data to first and second pages at the first wordline of the original block and programming copy first bit data and copy second bit data that is the same as the original data to the at least one mirroring block, wherein first bit data and second bit data of the original data are programmed to memory cells of the same word line of the original block, and first bit data and second bit data of the copy data are programmed to memory cells of different word lines of the at least one mirroring block.

* * * * *